United States Patent [19]
Westmoreland

[11] Patent Number: 6,143,192
[45] Date of Patent: Nov. 7, 2000

[54] RUTHENIUM AND RUTHENIUM DIOXIDE REMOVAL METHOD AND MATERIAL

[75] Inventor: Donald L. Westmoreland, Boise, Id.

[73] Assignee: Micron Technology, Inc., Boise, Id.

[21] Appl. No.: 09/146,365

[22] Filed: Sep. 3, 1998

[51] Int. Cl.$^7$ ........................................................ C23F 1/44
[52] U.S. Cl. .......................... 216/101; 216/108; 252/79.1; 134/22.16
[58] Field of Search .................... 216/6, 13, 38, 216/83, 96, 100, 101, 108; 252/79.1; 134/22.1, 22.16, 22.19, 41

[56] References Cited

U.S. PATENT DOCUMENTS

| | | | |
|---|---|---|---|
| 4,035,500 | 7/1977 | Dafter, Jr. | 427/261 |
| 4,297,436 | 10/1981 | Kubotera et al. | 430/310 |
| 4,670,306 | 6/1987 | Salem | 427/258 |
| 5,378,492 | 1/1995 | Mashiko | 427/1 |
| 5,480,854 | 1/1996 | Rajaram et al. | 502/304 |
| 6,015,506 | 1/2000 | Streinz et al. | 252/186.1 |

*Primary Examiner*—Randy Gulakowski
*Assistant Examiner*—Allan Olsen
*Attorney, Agent, or Firm*—Kirkpatrick & Lockhart LLP

[57] ABSTRACT

A method for removing at least a portion of a structure, such as a layer, film, or deposit, including ruthenium metal and/or ruthenium dioxide includes contacting the structure with a material including ceric ammonium nitrate. A material for removing ruthenium metal and amorphous ruthenium dioxide includes ceric ammonium nitrate and may be in the form of an aqueous solution including ceric ammonium nitrate and, optionally, other solid or liquid solutes providing desired properties. In one application, the method and material may be utilized to etch, shape, or pattern layers or films of ruthenium metal and/or ruthenium dioxide in the fabrication of semiconductor systems and their elements, components, and devices, such as wires, electrical contacts, word lines, bit lines, interconnects, vias, electrodes, capacitors, transistors, diodes, and memory devices.

50 Claims, No Drawings

RUTHENIUM AND RUTHENIUM DIOXIDE REMOVAL METHOD AND MATERIAL

CROSS-REFERENCE TO RELATED APPLICATIONS

Not applicable.

STATEMENT REGARDING FEDERALLY SPONSORED RESEARCH OR DEVELOPMENT

Not applicable.

TECHNICAL FIELD AND INDUSTRIAL APPLICABILITY OF THE INVENTION

The present invention relates to methods of and materials for etching, patterning, dissolving, or otherwise removing all or a portion of a ruthenium-containing structure such as, for example, a layer, a film, or a deposit. The present invention more particularly relates to methods of and materials for etching, patterning, dissolving, or otherwise removing at least a portion of a structure composed of ruthenium metal, ruthenium dioxide, or a combination of ruthenium metal and ruthenium dioxide, whether disposed on an object such as a substrate or otherwise.

The methods and materials of the present invention may be used in applications wherein it is desirable to etch, pattern, dissolve, or otherwise remove all or a portion of a layer, film, deposit, or other structure composed of ruthenium metal, ruthenium dioxide, or a combination of ruthenium metal and ruthenium dioxide. Examples of possible applications of the present methods and materials include the removal of waste deposits of ruthenium metal and ruthenium dioxide from the surfaces of tools, parts, components, and apparatuses employed in chemical vapor deposition, physical vapor deposition, and other techniques using ruthenium metal and/or ruthenium dioxide. The present invention's methods and materials may be incorporated into, for example, planarization techniques such as chemical mechanical planarization, and also may be utilized in, for example, the production of ruthenium masks, ruthenium-coated reflective mirrors, and catalytic ruthenium coatings, and in the fabrication of semiconductor systems and their elements, components, and devices, such as wires, electrical contacts, word lines, bit lines, interconnects, vias, electrodes, capacitors, transistors, diodes, and memory devices.

BACKGROUND OF THE INVENTION

Increasingly, ruthenium (Ru) metal is an important material in semiconductor device fabrication, and ruthenium layers, films, and other structures may be incorporated into semiconductor components and elements such as wires, electrical contacts, electrodes, capacitors, transistors, and diodes. Ruthenium also is used in many other applications and, for example, may be employed as building material for masks, as a coating on mirrors, to provide a surface for catalysis, or may be applied to objects by chemical or physical vapor deposition techniques so as to provide a surface coating having advantageous wear or corrosion properties.

One particularly advantageous application of ruthenium metal is its use in the formation of electrode layers in the fabrication of oxide high dielectric capacitors, wherein the ruthenium metal is typically applied either as a thin film by sputter deposition or as a conformal layer by metal organic chemical vapor deposition. Ruthenium is a conductive metal that oxidizes to form a similarly conductive ruthenium dioxide ($RuO_2$) layer on the surface of the existing ruthenium metal. Therefore, when an oxide high dielectric capacitor is formed, the surface of a ruthenium layer provided as the electrode material will not form a secondary dielectric layer when oxidized to $RuO_2$ during the oxygen anneal of the high dielectric material. The fact that ruthenium's oxide form is conductive distinguishes it from other conductive metal film materials such as, for example, tungsten, tantalum, and titanium, all of which form relatively non-conductive oxide layers. Certain other possible capacitor electrode materials do not oxidize during the application of an oxidizing anneal to the high dielectric material. One such capacitor electrode material is platinum. However, ruthenium provides advantages over platinum when used as a capacitor electrode in that platinum has a tendency to leak charge, a property that is not exhibited to the same degree by ruthenium.

In fabricating semiconductor devices incorporating a ruthenium metal film, such as, for example, the above-described oxide high dielectric capacitors, it may be necessary to etch, pattern, dissolve, or otherwise remove at least a portion of the ruthenium metal film or its dioxide so as to provide a suitably configured electrode or other structure or to completely remove such a film as an aid in recovering improperly coated devices. When ruthenium metal is provided on an object by chemical vapor deposition, physical vapor deposition, or other deposition techniques, a film or other deposit ruthenium metal and/or ruthenium dioxide may be deposited on surfaces of the tools, components, and apparatuses used in the deposition process, and it may be desirable to remove the ruthenium metal and/or ruthenium dioxide therefrom.

However, both ruthenium metal and ruthenium dioxide are resistant to removal by know wet etching techniques, and none of the wet etchants traditionally used in semiconductor device processing, including aqua regia and piranha, will dissolve ruthenium. In fact, both the CRC Handbook and the Merk Index list ruthenium metal as being insoluble in strong acids and oxidizers and as being soluble only in molten alkali salts, harsh etchants unsuitable for many applications, including semiconductor processing. Currently, if a layer or film of ruthenium metal or ruthenium dioxide must be etched or patterned in the fabrication of a semiconductor device, one of a number of dry etch procedures is used, including oxidizing argon plasma and $O_2$ plasma etch procedures. However, the use of any of those dry etch procedures to remove ruthenium metal or ruthenium dioxide results in the formation of the explosive compound ruthenium tetroxide ($RuO_4$). The ruthenium tetroxide must be removed or otherwise prevented from building to dangerous levels during the dry etch procedures, and this may increase the complexity and expense of such procedures.

Although ruthenium metal and ruthenium dioxide layers, films, and other structures are useful in semiconductor device fabrication, the use of such structures in that application has been limited because of the inability to satisfactorily etch or pattern the structures using wet etch techniques and the distinct disadvantages resulting from use of dry etch techniques. For like reasons, it has heretofore been difficult to remove undesirable films, layers, deposits, or other structures of ruthenium metal and ruthenium dioxide from tools and other objects. Accordingly, a need exists for an improved method for etching, patterning, or otherwise removing at least a portion of a ruthenium metal or ruthenium dioxide structure.

BRIEF SUMMARY OF THE INVENTION

The present invention addresses the above-described deficiencies in the known techniques and materials by providing a method for etching, patterning, dissolving, or otherwise removing all or a portion of a film, layer, deposit, or other structure including ruthenium metal and/or ruthenium dioxide by contacting the structure with a material including ammonium cerium (IV) nitrate, which also is known as ceric ammonium nitrate. The structure may be disposed on, for example, at least a portion of a substrate or other object.

The present invention also provides a material that includes ceric ammonium nitrate and that may be utilized in the method of the invention to remove all or a portion of a structure including ruthenium metal and/or ruthenium dioxide. According to one aspect of the invention, the material is an aqueous solution including ceric ammonium nitrate, and the solution may include other components such as, for example, components that provide the solution with desired properties.

The material and method of the present invention do not result in the formation of the tetroxide form of ruthenium when used to etch, pattern, dissolve, or otherwise remove ruthenium metal and/or ruthenium dioxide from structures including those materials and provide an alternative to known dry etch procedures for removing ruthenium metal and ruthenium dioxide from structures including those materials.

DETAILED DESCRIPTION OF THE INVENTION

As described herein, a method is provided for etching, patterning, dissolving, or otherwise removing all or a portion of a film, layer, deposit, or other structure composed of ruthenium metal and/or ruthenium dioxide. In the method, at least a portion of a structure comprising ruthenium and/or ruthenium dioxide (whether deposited on at least a portion of a substrate or an object, or otherwise provided) is removed by contacting at least a region of a surface of the structure with a material comprising ceric ammonium nitrate. The inventor has discovered that material comprising ceric ammonium nitrate will remove ruthenium metal or amorphous ruthenium dioxide without the formation of the explosive tetroxide form of ruthenium.

Accordingly, the material of the invention for removing ruthenium metal and/or ruthenium dioxide includes an amount of ceric ammonium nitrate. The material of the invention may be, for example, a solution of ceric ammonium nitrate. The material may be in the form of a liquid etchant solution, and, in one form, the solution may be an aqueous solution wherein ceric ammonium nitrate and, optionally, other solutes, are dissolved in liquid water. Such other solutes may include, for example, acetic acid and other liquid or solid solutes such as agents for buffering or enhancing dissolution of the ceric ammonium nitrate in the solvent. Other additional components that may be added to the solution will be apparent to those having ordinary skill in the art. In one form, the material of the invention may include about 0.5 to about 70 weight percent ceric ammonium nitrate. As used in the method of the present invention, the material of the present invention may be, for example, an aqueous solution including about 30 weight percent ceric ammonium nitrate, about 10 weight percent acetic acid, and about 60 weight percent water.

When the ceric ammonium nitrate material of the invention is applied as a liquid solution, it may be applied to the structure using any suitable technique for contacting a surface with a liquid, including immersion and spray techniques. The solution also may be applied to the surface as a component of a slurry. Once apprised of the details of the invention as described herein, one of skill in the art will readily comprehend additional methods for applying the material of the invention, whether in liquid form or otherwise, to a structure. When applied by an immersion or similar technique, the immersion bath may be agitated in order to enhance the contact of the ceric ammonium nitrate with the ruthenium metal and/or ruthenium dioxide to be removed. The ceric ammonium nitrate material, whether a solution or otherwise, may be applied to the ruthenium metal and/or ruthenium dioxide structure at room temperature, if desired, and one manner of contacting at least a surface of the structure is to immerse at least a portion of the structure in an aqueous ceric ammonium nitrate solution.

As used herein, the term "structure" refers to any monolithic mass of a material, including one or more layers, films, or deposits of any configuration, including active or operable portions of a semiconductor device. The term "substrate" as used herein refers to any thing on or in which a structure may be provided. For example, substrates include silicon-based materials, such as silicon, silicon dioxide ($SiO_2$), and borophosphosilicate glass (BPSG), and also include other materials, including stainless steel, quartz, and insulators such as sapphire. Substrates also refer to one or more layers that may include all or a portion of a structure. When a structure is formed on a substrate, it may be formed directly on the substrate or it may be formed on the substrate with one or more intermediate layers between it and the substrate. A substrate is often the lowest layer of material in a wafer. The present invention may be utilized with a doped silicon substrate, or with other structures and technologies, such as silicon-on-insulator, silicon-on-sapphire, and thin film transistors.

According to one aspect of the invention, the method and material of the invention may be applied to etch, shape, or pattern structures of ruthenium metal and/or ruthenium dioxide during the fabrication of semiconductor systems and their elements, components, and devices, including the fabrication of wires, electrical contacts, word lines, bit lines, interconnects, vias, electrodes, capacitors, transistors, diodes, and memory devices. The method and material of the present invention also may be used to etch, shape, or pattern ruthenium metal or ruthenium dioxide structures in other applications such as, for example, fabrication of ruthenium masks, ruthenium-coated reflective mirrors, and catalytic ruthenium coatings. Because the present material may be applied to a structure as a liquid solution and does not result in the formation of ruthenium's explosive tetroxide form, it provides an advantageous alternative to existing ruthenium dry etch procedures.

The method and material of the invention also may be used to remove waste deposits of ruthenium metal and ruthenium dioxide from the surfaces of tools, parts, components, and apparatuses employed in chemical vapor deposition, physical vapor deposition, and other techniques for providing ruthenium metal and/or ruthenium dioxide on a substrate or other object. As an example, after completing a chemical vapor deposition process of coating ruthenium metal onto an object, ruthenium metal also may coat the several components of the deposition apparatus. Such components include the surfaces of the deposition chamber, the quartz susceptor window in the bottom of the deposition chamber, any plates or shields, and the shower head. As another example, after completion of a sputter process of coating ruthenium metal on an object, the ruthenium metal may coat the sputter shields, collimator, sputter target, and deposition chamber. After either process, everything but the object that is to be coated must be cleaned and may be done so conveniently by the present invention. Accordingly, the present invention is directed to a method for removing a layer, film, coating, or other deposit of ruthenium metal or ruthenium dioxide from an object including, for example, a tool, a part, a component, a window, a plate, a shield, a shower head, a collimator, or a chamber wall. In that process, the object is contacted with the material of the invention using a technique such as, for example, a spray or immersion technique.

The ceric ammonium nitrate material of the present invention, whether in solution form or otherwise, also may be used as an active chemical component of a slurry used in a planarization process for planarizing a surface. In such an application, the material of the invention is applied to the surface and acts to remove ruthenium metal and/or ruthenium dioxide from the surface that is planarized. The planarization process may be a chemical mechanical planarization process, which may include application of a frictional force, such as mechanical abrasion, to the slurry on the surface. Other parameters of the planarization process may be readily determined by or will be apparent to those of ordinary skill.

Accordingly, the present invention also provides for a slurry for use in planarization processes, including chemical mechanical planarization, and that includes an amount of ceric ammonium nitrate. The slurry form of the present invention provides selective application of the material of the invention so as to restrict the region from which ruthenium metal and/or ruthenium dioxide is removed. The slurry may include, for example, an amount of the material of the present invention in a form suitable for incorporation into the slurry.

The present invention also is directed to a method for forming a structure on a substrate wherein ruthenium metal is provided on at least a portion of a surface of the substrate and a portion of the ruthenium metal is removed therefrom by contacting at least a region of the ruthenium metal with the material of the present invention, as described above and including, for example, applying the material by spray or immersion techniques, so as to remove a portion of the ruthenium metal. The ruthenium metal may be provided on the substrate by any known technique for providing ruthenium metal on a surface, including chemical vapor deposition, physical vapor deposition, and sputter techniques, and may form all or a portion of a device.

The present invention also encompasses a method for forming a structure wherein a layer of amorphous ruthenium dioxide is provided on a substrate and the amorphous ruthenium dioxide is contacted with the material of the invention, as described above and including, for example, applying the material by spray or immersion techniques, so as to remove a portion of the ruthenium dioxide. The amorphous ruthenium dioxide may be provided by any method known to those of ordinary skill in the art and may form all or a portion of a device.

In addition, the present invention includes a method for forming a device wherein a first layer including ruthenium metal and/or ruthenium dioxide is provided on at least a portion of a substrate, and a portion of the first layer is subsequently removed by contacting at least a region of the first layer with the ceric ammonium nitrate-containing material of the invention, as described above. The device may be, for example, a memory device, a capacitor, a transistor, a diode, a wire, an electrical contact, a word line, a bit line, an interconnect, an electrode, or a via. Subsequent to removal of a portion of the first layer by the present invention's material, a second layer of ruthenium metal and/or ruthenium dioxide, or of some other material, may be provided adjacent to the first layer. The first and second layers may be provided by any known method.

The present invention also is directed to a method for forming a device wherein a first layer of ruthenium metal and/or ruthenium dioxide is provided on at least a portion of a surface of a substrate, at least a portion of the ruthenium metal in the first layer is oxidized, and at least a portion of the first layer is removed by contacting at least a region of the first layer with the material of the present invention so as to remove ruthenium metal and/or ruthenium dioxide form the first layer. The first layer may be oxidized by any known means for oxidizing ruthenium metal, including a rapid thermal anneal process.

A method for patterning a ruthenium metal structure also is provided and includes contacting at least a region of a surface of a structure of ruthenium metal with the material of the invention, as described above. The method also may include the act of providing a mask on the ruthenium metal structure prior to contacting the surface of the structure with the material of the invention. The method also may include the step of removing the mask subsequent to contacting the surface of the structure with the material of the invention. The ruthenium metal structure and the mask may be provided, and the mask may be removed, using techniques known to those of skill in the art.

As discussed above, one application of ruthenium metal is as the electrode in a capacitor. Accordingly, the present invention also includes a method for forming a capacitor wherein:

a first layer including ruthenium metal is provided on at least a portion of a substrate;

the first layer is etched using the ceric ammonium nitrate-containing material of the present invention to provide a first electrode;

a second layer including ruthenium metal is provided on at least a portion of the substrate;

the second layer is etched using the ceric ammonium nitrate-containing material of the invention to provide a second electrode; and a dielectric is formed between the first and second electrodes.

In the foregoing method for forming a capacitor, the act of forming the dielectric may occur prior to the act of providing the second layer and, also, may include providing the dielectric on at least a region of a surface of the first electrode. More particularly, the act of forming the dielectric may encompass providing a material on at least a region of a surface of the first electrode and then oxidizing at least a portion of the material to provide the desired dielectric properties.

In a more basic form, the present invention includes a method for forming an electrode for a capacitor and wherein a layer of ruthenium metal is provided on at least a portion of a substrate, and the layer is subsequently patterned by applying the material of the invention to at least a region of the layer.

The results achieved by use of the method of the present invention and by conventional etch methods on ruthenium metal films and ruthenium oxide films are provided in the examples below.

EXAMPLE 1

Samples of ruthenium metal deposited by chemical vapor deposition on $SiO_2$ were placed in baths of the following materials: aqua regia (3 parts hydrochloric acid and 1 part nitric acid) at approximately 100° C.; piranha solution (a mixture of 1 part of a 50 weight % peroxide aqueous solution and 1 part of 98–99% sulfuric acid) at approximately 100° C.; HCl/peroxide at approximately 85° C.; 85% phosphoric acid solution at approximately 150° C.; ammonium hydroxide/peroxide (50/50 by weight) at approximately 100° C.; pure 100% liquid bromine at room temperature (approximately 20–25° C.); 10% by weight bromine ($Br_2$) in water at approximately 20–25° C.; and KOH aqueous solution (approximately 30 weight % KOH at approximately 85° C.). Each of the foregoing materials were allowed to contact the ruthenium metal deposit for at least 30 minutes and in each case a detectable amount of ruthenium metal was not removed from the $SiO_2$ substrate.

The runs of Example 1 show that several know wet etching materials, as well as other, harsher materials, will not remove ruthenium from a layer of that metal at a commercially significant rate.

EXAMPLE 2

Samples of ruthenium and ruthenium dioxide films on silicon, its thermal oxide ($SiO_2$), and borophosphosilicate glass (BPSG) were immersed in a room temperature (approximately 20–25° C.) bath of CR-14 Chrome Etchant obtained from Cyantek Corporation, Fremont, California. The CR-14 Chrome Etchant consisted of 30% by weight ceric ammonium nitrate, 10% by weight acetic acid, and 60% by weight water and is commonly used for etching chromium and chromium dioxide. The parameters and results of each run are provided below in Table 1. It will be seen that the CR-14 Chrome Etchant removed ruthenium metal from each of the three substrates. The estimated ruthenium metal etch rates achieved were as high as 11.67 Å/sec. (Ru on 8 K thermal oxide) and as low as 2.63 Å/sec. (Ru on BPSG). The etchant also removed ruthenium dioxide from each of the three substrates if the ruthenium dioxide was deposited on the substrate in an amorphous form. No crystalline ruthenium dioxide was removed by the CR-14 Chrome Etchant.

TABLE 1

| Material | Film Deposition Method/ Deposition Temperature | Characteristics of Deposited Ru or $RuO_2$ Film | Approximate Film Thickness (Å) | Estimated Etch Time | Estimated Etch Rate (Å/sec.) | Comments |
|---|---|---|---|---|---|---|
| Ru on Si | CVD/200° C. | crystalline | 400 | <2 min. | 3.33 | Ru film flaked off immediately in etchant bath, but dissolved in etchant within 2 min. |
| Ru on Si | CVD/250° C. | crystalline | 1100 | <2 min. | 9.17 | Ru film flaked off immediately in etchant bath, but dissolved in etchant within 2 min. |
| Ru on Si | CVD/350° C. | crystalline | 320 | 30 sec. | 10.67 | Ru film etched off without flaking. |
| Ru on 8 K (8000 Å) thermal oxide ($SiO_2$) | CVD/200° C. | crystalline | 500 | <30 min. | | |
| Ru on 8 K thermal oxide ($SiO_2$) | CVD/200° C. | crystalline | 350 | 30 sec. | 11.67 | Ru film flaked off immediately in etchant bath, but dissolved within etchant within 30 sec. |
| Ru on BPSG | CVD/200° C. | crystalline | 790 | <5 min. | 2.63 | Ru film flaked off immediately in etchant bath, but dissolved within etchant within 5 min. |
| $RuO_2$ on Si | CVD/150° C. | amorphous | 375 | <1 min. | 6.25 | $RuO_2$ film did not flake. |
| $RuO_2$ on Si | CVD/150° C. | amorphous | 250 | <4 min. | 1.04 | $RuO_2$ film did not flake. |
| $RuO_2$ on Si | CVD/300° C. | crystalline | 125 | no etch | 0 | $RuO_2$ film did not appear to etch within 30 min. |
| $RuO_2$ on 8 K thermal oxide ($SiO_2$) | CVD/150° C. | amorphous | 375 | <1.5 min. | 4.17 | $RuO_2$ film did not flake. |
| $RuO_2$ on BPSG | CVD/150° C. | amorphous | 950 | <1 min. | 15.83 | $RuO_2$ film did not flake. |
| $RuO_2$ on BPSG | CVD/300° C. | crystalline | <100 | no etch | 0 | $RuO_2$ film did not appear to etch within 20 min. |

EXAMPLE 3

Samples of ruthenium and ruthenium dioxide provided on silicon substrates were annealed using a rapid thermal process (RTP) in which the samples were quickly heated from room temperature to 750° C. and were then immersed in a room temperature (20–25° C.) bath of the CR-14 Chrome Etchant. The methods by which the ruthenium films were deposited on the substrates and then annealed are provided in Table 2. Table 2 also provides the estimated times during which etching occurred and an estimated etch rate for each run. As was observed with the $RuO_2$ films in Example 2 that were not annealed, the annealed crystalline ruthenium dioxide film was not etched in the procedure.

TABLE 2

| Material | Film Deposition Method/ Deposition Temperature | Characteristics of Deposited Ru or RuO$_2$ Film | Approximate Film Thickness (Å) | Anneal Procedure | Estimated Etch Time | Estimated Etch Rate (A/sec.) | Comments |
| --- | --- | --- | --- | --- | --- | --- | --- |
| RuO$_2$ on Si | CVD/150° C. | amorphous | 250 | RT Pin N$_2$ @ 850° C. for 30 sec. | 4 min. | 1.04 | A conductive RuO$_2$ layer existed under the material etched away. |
| RuO$_2$ on Si | CVD/300° C. | crystalline | 600 | RT Pin O$_2$ @ 850° C. for 30 sec. | no etch | 0 | Film did not appear to be etched within 10 min. |
| Ru on Si | CVD/200° C. | crystalline | 400 | RT Pin N$_2$ @ 850° C. for 30 sec. | 10 min. | 0.67 | Film flaked off immediately and most of the flakes dissolved in the etchant in less than 10 min., but a residue remained at 10 min. |

Accordingly, the present invention provides an improved method and material for etching, patterning, dissolving, or otherwise removing at least a portion of a structure including ruthenium metal and/or ruthenium dioxide.

The present invention has been described in connection with certain embodiments thereof. Those of ordinary skill in the art will recognize that many modifications and variations may be employed. All such modifications and variations are intended to be covered by the foregoing description and the following claims.

I claim:

1. A method for removing at least a portion of a structure comprising ruthenium, the method comprising contacting the structure with a material comprising ceric ammonium nitrate.

2. The method of claim 1 wherein the structure consists of ruthenium metal.

3. The method of claim 1 wherein the structure consists of amorphous ruthenium dioxide.

4. The method of claim 1 wherein the structure is selected from the group consisting of a layer and a film.

5. The method of claim 1 wherein the material is a solution further comprising liquid water.

6. The method of claim 1 wherein the solution comprises about 0.5 to about 70 weight percent ceric ammonium nitrate.

7. The method of claim 6 wherein the solution further comprises water and acetic acid.

8. The method of claim 7 wherein the solution consists of about 30 weight percent ceric ammonium nitrate, about 10 weight percent acetic acid, and about 60 weight percent water.

9. The method of claim 5 wherein the solution is at approximately room temperature.

10. The method of claim 5 wherein the act of contacting at least a surface of the structure with the solution comprises immersing at least a portion of the structure in the solution.

11. The method of claim 1 wherein the structure is disposed on at least a portion of a substrate.

12. The method of claim 11 wherein the substrate comprises a material selected from the group consisting of silicon, SiO$_2$, and BPSG.

13. The method of claim 1 wherein the structure is disposed on at least a portion of an object.

14. The method of claim 13 wherein the object is selected from the group consisting of a tool, a part, a component, a window, a plate, a shield, a shower head, a collimator, and a chamber wall.

15. The method of claim 1 wherein the structure is selected from the group consisting of a layer, a film, or a deposit.

16. A method for removing at least a portion of a ruthenium metal structure, the method comprising contacting at least a region of a surface of the ruthenium metal structure with a solution comprising ceric ammonium nitrate.

17. The method of claim 16 wherein the solution comprises about 0.5 to about 70 weight percent ceric ammonium nitrate.

18. The method of claim 16 wherein the solution further comprises liquid water.

19. The method of claim 18 wherein the solution further comprises acetic acid.

20. The method of claim 19 wherein the solution consists of about 30 weight percent ceric ammonium nitrate, about 10 weight percent acetic acid, and about 60 weight percent water.

21. The method of claim 16 wherein the ruthenium metal layer is disposed on at least a portion of a substrate.

22. The method of claim 21 wherein the substrate comprises a material selected from the group consisting of silicon, SiO$_2$, and BPSG.

23. The method of claim 15 wherein the structure is disposed on at least a portion of an object.

24. The method of claim 23 wherein the object is selected from the group consisting of a tool, a part, a component, a window, a plate, a shield, a shower head, a collimator, and a chamber wall.

25. The method of claim 16 wherein the act of contacting at least a region of a surface of the ruthenium metal layer with the liquid comprises immersing the region of the surface in the solution.

26. A method for removing at least a portion of an amorphous ruthenium dioxide layer, the method comprising contacting at least a region of a surface of the ruthenium dioxide layer with a liquid comprising ceric ammonium nitrate.

27. The method of claim 26 wherein the solution comprises about 0.5 to about 70 weight percent ceric ammonium nitrate.

28. The method of claim 27 wherein the solution further comprises liquid water.

29. A method of etching at least a region of a structure comprising ruthenium, the method comprising subjecting at least a region of a surface of the structure to a solution comprising ceric ammonium nitrate, acetic acid, and water.

30. The method of claim 29 wherein the solution comprises about 0.5 weight percent to about 70 weight percent ceric ammonium nitrate.

31. A method for patterning a ruthenium metal structure, the method comprising contacting at least a region of a surface of the structure with an aqueous solution comprising ceric ammonium nitrate.

32. The method of claim 31, further comprising providing a mask on the structure prior to contacting the surface of the structure.

33. The method of claim 32, further comprising removing the mask from the structure subsequent to contacting the surface of the structure.

34. The method of claim 31 wherein the solution comprises about 0.5 weight percent to about 70 weight percent ceric ammonium nitrate.

35. A method for forming a structure on a substrate, the method comprising:

providing ruthenium metal on at least a portion of a surface of the substrate; and removing a portion of the ruthenium metal on the surface by contacting at least a region of the ruthenium metal with a solution comprising ceric ammonium nitrate.

36. The method of claim 35 wherein the solution comprises about 0.5 to about 70 weight percent ceric ammonium nitrate.

37. The method of claim 35 wherein the structure forms at least a portion of a device.

38. The method of claim 36 wherein the solution consists of about 30 weight percent ceric ammonium nitrate, about 10 weight percent acetic acid, and about 60 weight percent liquid water, the percentages calculated based on the entire weight of the solution.

39. The method of claim 35 wherein the structure is selected from the group consisting of a layer, a film, and a deposit.

40. A method for forming a structure on a substrate, the method comprising:

providing a layer of amorphous ruthenium dioxide on at least a portion of a surface of the substrate; and contacting at least a region of the layer with a solution comprising ceric ammonium nitrate.

41. The method of claim 40 wherein the solution comprises about 0.5 to about 70 weight percent ceric ammonium nitrate.

42. A method for forming a device, the method comprising:

providing a first layer comprising ruthenium on at least a portion of a substrate; and removing a portion of the first layer by contacting at least a region of the first layer with a solution comprising ceric ammonium nitrate.

43. The method of claim 42 wherein the device is selected from the group consisting of a memory device, a capacitor, a transistor, a diode, a wire, an electrical contact, a word line, a bit line, an interconnect, an electrode, and a via.

44. The method of claim 42 wherein the first layer consists of at least one of ruthenium metal and ruthenium dioxide.

45. The method of claim 42, further comprising, subsequent to the act of removing a portion of the first layer, providing a second layer of a material adjacent to the first layer.

46. A method for forming a device, the method comprising:

providing a first layer of ruthenium metal on at least a portion of a surface of a substrate;

oxidizing at least a portion of the ruthenium metal in the first layer; and removing at least a portion of the first layer by contacting at least a region of the first layer with a solution comprising ceric ammonium nitrate.

47. A method for removing an amount of ruthenium metal from a structure consisting of ruthenium metal, the method comprising contacting at least a region of a surface of the structure with a solution consisting of 30 weight percent ceric ammonium nitrate, 10 weight percent acetic acid, and 60 weight percent water.

48. A method for removing an amount of amorphous ruthenium dioxide from a structure consisting of amorphous ruthenium dioxide, the method comprising contacting at least a region of a surface of the structure with a solution consisting of 30 weight percent ceric ammonium nitrate, 10 weight percent acetic acid, and 60 weight percent water.

49. A method for removing a deposit of a material selected from ruthenium metal, ruthenium dioxide, and a combination of ruthenium metal and ruthenium dioxide from a surface of an object, the method comprising immersing at least a portion of the object in a solution comprising about 0.5 weight percent to about 70 weight percent ceric ammonium nitrate.

50. The method of claim 49 wherein the object is selected from the group consisting of a tool, a part, a component, a window, a plate, a shield, a shower head, a collimator, and a chamber wall.

* * * * *